United States Patent
Naeem et al.

(10) Patent No.: US 6,359,325 B1
(45) Date of Patent: Mar. 19, 2002

(54) METHOD OF FORMING NANO-SCALE STRUCTURES FROM POLYCRYSTALLINE MATERIALS AND NANO-SCALE STRUCTURES FORMED THEREBY

(75) Inventors: Munir D. Naeem, Poughkeepsie; Lawrence A. Clevenger, Lagrangeville, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/523,866

(22) Filed: Mar. 14, 2000

(51) Int. Cl.$^7$ ............................................... H01L 29/00
(52) U.S. Cl. ..................... 257/529; 438/132; 438/215; 438/281; 438/467; 438/601
(58) Field of Search .......................... 257/754; 438/132, 438/215, 281, 467, 601, 166; 427/452, 455

(56) References Cited

U.S. PATENT DOCUMENTS

| | | | | |
|---|---|---|---|---|
| 5,318,661 A | * | 6/1994 | Kumomi ......................... 117/8 |
| 5,714,404 A | * | 2/1998 | Mitlitsky ..................... 437/233 |
| 5,830,538 A | * | 11/1998 | Gates et al. ................. 427/535 |
| 5,874,134 A | * | 2/1999 | Rao et al. .................... 427/446 |
| 5,894,137 A | | 4/1999 | Yamazaki ..................... 257/66 |
| 5,948,162 A | | 9/1999 | Nakamura ..................... 117/90 |
| 5,948,470 A | * | 9/1999 | Harrison et al. ............. 427/198 |
| 6,025,217 A | * | 2/2000 | Kanaya et al. ............... 438/166 |
| 6,040,230 A | * | 3/2000 | Anthony et al. ............. 438/398 |
| 6,277,448 B2 | * | 8/2001 | Strutt et al. .................. 427/452 |

* cited by examiner

*Primary Examiner*—David Nelms
*Assistant Examiner*—Tu-Tu Ho
(74) *Attorney, Agent, or Firm*—Gary M. Hartman; Domenica N. S. Hartman; Casey P. August

(57) ABSTRACT

A method of forming nano-scale features with conventional multilayer structures, and nano-scale features formed thereby. The method generally entails forming a multilayer structure that includes a polycrystalline layer and at least one constraining layer. The multilayer structure is patterned to form first and second structures, each of which includes the polycrystalline and constraining layers. At least the first structure is then locally heated, during which time the constraining layer restricts the thermal expansion of the polycrystalline layer of the first structure. As a result, stresses are induced in the polycrystalline layer of the first structure, causing substantially two-dimensional grain growth from the edge of the first structure. Sufficient grain growth occurs to produce a third structure which, based on the grain size of the polycrystalline layer, will be a nano-scale structure. When appropriately configured, nano-scale structures can be formed as operative components of electrical, mechanical, optical and fluid-handling devices.

44 Claims, 5 Drawing Sheets

METHOD OF FORMING NANO-SCALE STRUCTURES FROM POLYCRYSTALLINE MATERIALS AND NANO-SCALE STRUCTURES FORMED THEREBY

BACKGROUND OF THE INVENTION

1. Field of the Invention

The present invention generally relates to the fabrication of microscale structures, such as metallization for microelectronic applications. More particularly, this invention relates to a method of forming nano-scale structures by initiating lateral grain growth from polycrystalline materials.

2. Description of the Prior Art

As represented in FIG. 1, backend of the line (BEOL) interconnect metallization 10 often includes an electrically-conductive layer 12 of an aluminum-copper alloy that is sandwiched between a pair of diffusion barrier layers 14. The diffusion barrier layers 14 reduce the solid state diffusion rate between the conductive layer 12 and metals from surrounding metal structures, so as to improve the reliability and sheet resistance of the metallization 10. In the past, metallization 10 of this type has been patterned by conventional lithographic techniques to produce various structural features, such as metal pads and lines. While lithographic techniques are widely and successfully used in the art, nano-scale features (i.e., operative structures and components that require a controlled dimension of less than ten nanometers) are difficult to form by conventional lithography. In view of the demand for greater miniaturization of microcircuits and their components, it would be desirable if a method were available that enabled the patterning of metallization to form nano-scale features.

SUMMARY OF THE INVENTION

The present invention provides a method of forming nano-scale features with conventional polycrystalline structures, such as metallization for microelectronic applications. A key aspect of the invention is the determination of the mechanism by which lateral grain growth can be induced and controlled in a multilayer structure having a polycrystalline layer and a second layer that serves as a constraining layer when the multilayer structure is heated. This mechanism is believed to involve the growth of grains that have been sectioned by patterning to have fewer than six grain boundaries, six grain boundaries being the most thermodynamically stable grain structure. If sufficiently heated, those grains having fewer than six boundaries and located at the patterned edge of the polycrystalline layer will undergo grain growth. If constrained, as is the case when the polycrystalline layer contacts a second layer with a lower coefficient of thermal expansion, stresses induced by the second layer will cause this grain growth to be predominantly lateral (i.e., two-dimensional and in the plane of the polycrystalline layer) and outward from the patterned edge of the polycrystalline layer.

In view of the above, the method of this invention generally entails forming a multilayer structure that includes a polycrystalline layer and at least one constraining layer. The multilayer structure is patterned to form first and second structures, each of which includes the polycrystalline and constraining layers. At least the first structure is then locally heated, during which time the constraining layer restricts the thermal expansion of the polycrystalline layer of the first structure. As a result, stresses are induced in the polycrystalline layer of the first structure, causing substantially two-dimensional grain growth from the edge of the first structure. Sufficient grain growth occurs to produce a third structure which is, based on an average grain size of, for example, 4 µm or less, a nano-scale structure, defined herein as designating a structure with at least one dimension that is less than ten nanometers. When appropriately configured, nano-scale structures formed in accordance with this invention can be an operative component of an electrical, mechanical, optical or fluid-handling device.

In view of the above a significant advantage of this invention is that nano-scale features can be selectively formed for devices that may be employed in a wide variety of applications. An important example is the forming of nano-scale features from conventional circuit metallization such as that shown in FIG. 1, in which the electrically-conductive layer 12 is a polycrystalline layer sandwiched between a pair of diffusion barrier layers 14 that serve as constraining layers. Notably, this invention makes use of a phenomenon that might otherwise be viewed as a flaw, as would be the case if the nano-scale feature creates an electrical short between adjacent interconnect metallizations.

Other objects and advantages of this invention will be better appreciated from the following detailed description.

DETAILED DESCRIPTION OF THE PREFERRED EMBODIMENT

Figure 1:
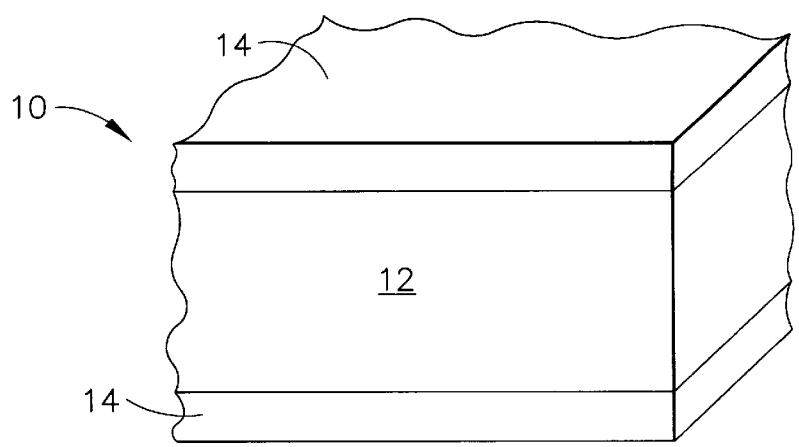
FIG. 1 represents a perspective view of a multilayer metallization suitable for use in the present invention.

The present invention is directed to a process for forming nano-scale structures or components from a multilayer structure that includes a polycrystalline layer sandwiched between a pair of constraining layers. For illustrative purposes, the invention will be described in reference to FIGS. 2 through 11, which will be discussed in terms of process steps for forming nano-scale electrical, mechanical, optical and fluid-handling structures or components from the multilayer metallization 10 shown in FIG. 1, and therefore including a conductive polycrystalline layer 12 sandwiched between a pair of diffusion barrier layers 14. However, from the following discussion, those skilled in the art will appreciate that a wide variety of materials and material combinations can be employed for the polycrystalline and constraining layers of the multilayer structure, including dielectric, conductive and semiconductive materials. As will also become apparent, the basic material requirements for a multilayer structure suitable for use with the teachings of this invention are that a first layer has a polycrystalline grain structure, and that at least one other layer contacting the first layer has a coefficient of thermal expansion that is sufficiently lower than the first layer such that, when the multilayer structure is sufficiently heated, stresses are induced within the polycrystalline layer to initiate lateral grain growth from the polycrystalline layer.

As is known in the art, aluminum-copper alloys are widely used for the conductive polycrystalline layer 12 of circuit interconnect metallizations, such as BEOL interconnect metallizations. Diffusion barrier layers 14 formed of materials such as titanium, titanium nitride and combinations of both, are used to reduce the solid state diffusion rate between the polycrystalline layer 12 and metals from surrounding metal structures. The barrier layers 14 (and any constraining layer employed by the invention) can have an amorphous, polycrystalline or single crystal microstructure. The thickness of the metallization 10 can vary, with thicknesses of about 0.25 μm and less being typical for certain interconnect applications. The thicknesses of the metallization 10 and its layers 12 and 14 are not particularly critical limitations, as long as sufficient stresses can be induced to cause the desired lateral grain growth in the polycrystalline layer 12. While Al—Cu alloys are preferred for the polycrystalline layer 12, and titanium and titanium nitride are preferred materials for the barrier layers 14, other materials could foreseeably be used to form the metallization 10. In addition, one of the barrier layers 14 could be omitted, and additional metal layers could be encapsulated within the polycrystalline layer 12 or between the conductive and barrier layers 12 and 14.

Figure 2:
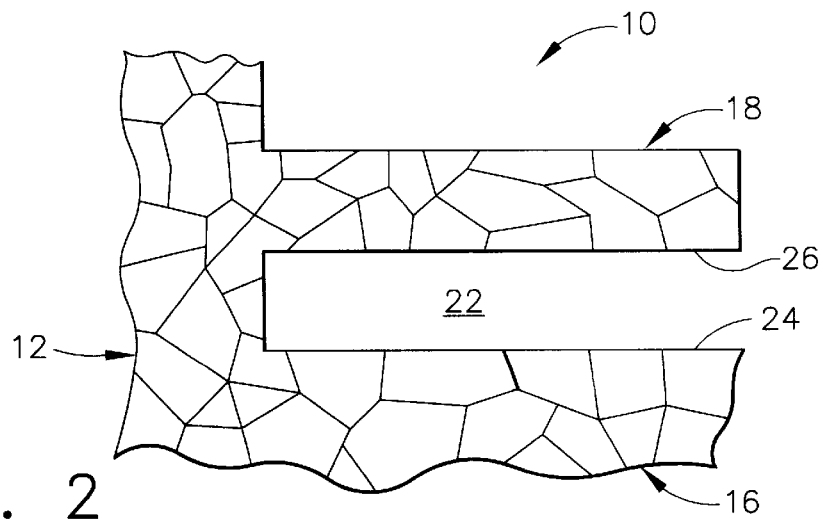
FIGS. 2 and 3 represent process steps for forming a cantilever with one end stabilized by a nano-scale feature for use in mechanical applications.
Figure 3:
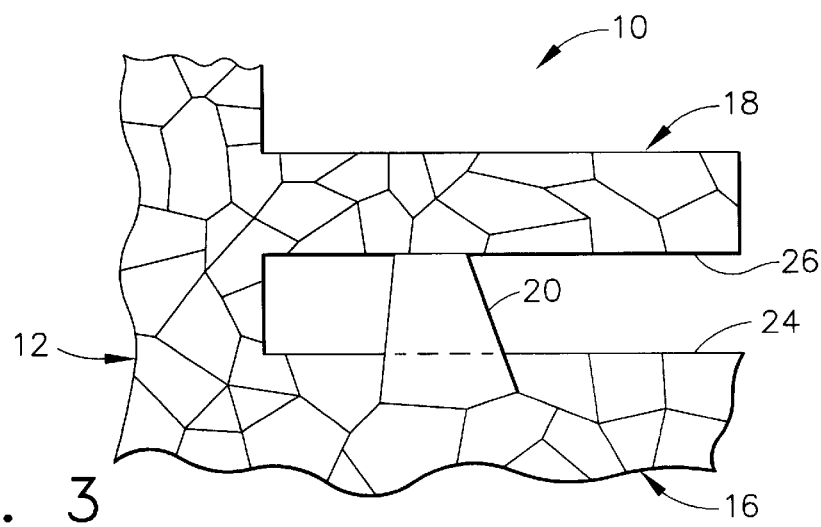

According to this invention, lateral grain growth has been found to occur with metallization formed by prior art metallization processes in which the metallization is patterned to form such conventional circuit interconnects as metal lines and metal pads. In FIGS. 2 and 3, the upper diffusion barrier layer 14 of the metallization 10 of FIG. 1 has been omitted, allowing the grain boundaries of the polycrystalline layer 12 to be schematically represented to help illustrate the mechanism determined to be active in causing lateral (two-dimensional) grain growth, i.e., grain growth that is substantially in the plane of the polycrystalline layer 12). FIGS. 2 and 3 represent the typical grain structure of an Al—Cu alloy polycrystalline layer 12 after deposition by such methods as electroplating, sputtering, evaporation, chemical or physical vapor deposition etc. The grain structure and texture of the polycrystalline layer 12 will depend on many factors including deposition conditions and the type of substrate and barrier materials used. In one example, the average grain size of the Al—Cu polycrystalline layer 12 may be on the order of about 0.005 to about 20 μm if deposited by electroplating, sputtering, evaporation, or chemical or physical vapor deposition. The metallization 10 is shown in FIG. 2 as having been patterned by such known methods as lithography and metal reactive ion etching (RIE), by which two features 16 and 18 have been delineated by a trench 22 in the metallization 10. The trench 22 delineates opposing edges 24 and 26 of the features 16 and 18, respectively. The spacing between these edges 24 and 26 is shown as being approximately equal to the average grain size in the polycrystalline layer 12 (e.g., about 2 to 3 μm), though greater and lesser line spacing could be employed. The grains at the edges 24 and 26 of the metal pad 16 and metal lines 18 are sectioned by the trench 22 as a result of the patterning process. FIG. 3 represents the effect of selectively and locally heating the feature 16, such as with a laser or electrical probe current, causing lateral grain growth of one or more grains at the edge 24 of this feature 16. In FIG. 3, sufficient lateral grain growth has occurred such that a third feature 20 has been extruded from the polycrystalline layer 12 between the barrier layers 14, projecting across the trench 22 so as to abut the second feature 18.

According to this invention, the third feature 20 is the result of stress conditions in the polycrystalline layer 12 during the localized heat treatment. In the present example, the Al—Cu polycrystalline layer 12 has a higher coefficient of thermal expansion than the titanium and/or titanium nitride barrier layers 14, but is physically constrained by the barrier layers 14. As a result of the patterning process, grains along the patterned edge 24 of the feature 16 are left with grain boundaries greater or fewer than six. According to this invention, grains with fewer than six grain boundaries are unstable and, if sufficiently heated, subject to lateral (two-dimensional) grain growth as a result of the diffusion barrier layers 14 inhibiting grain growth and thermal expansion of the polycrystalline layer 12 in the direction of the thickness of the metallization 10. Modeling such as Mullins-Von Neumann can be used to predict the grain growth under such conditions. Based on two-dimensional grain growth modeling, when the edge 24 of the feature 16 from which the third feature 20 grows is sufficiently heated, generally to a temperature below the melting temperature of the polycrystalline layer 12 (e.g., about 200° C. to about 300° C. for Al—Cu alloys), those grains within the heated edge and with less than six grain boundaries will grow to effectively form a nano-scale extrusion that projects from between the diffusion barrier layers 14 into the trench 22.

Figure 4:
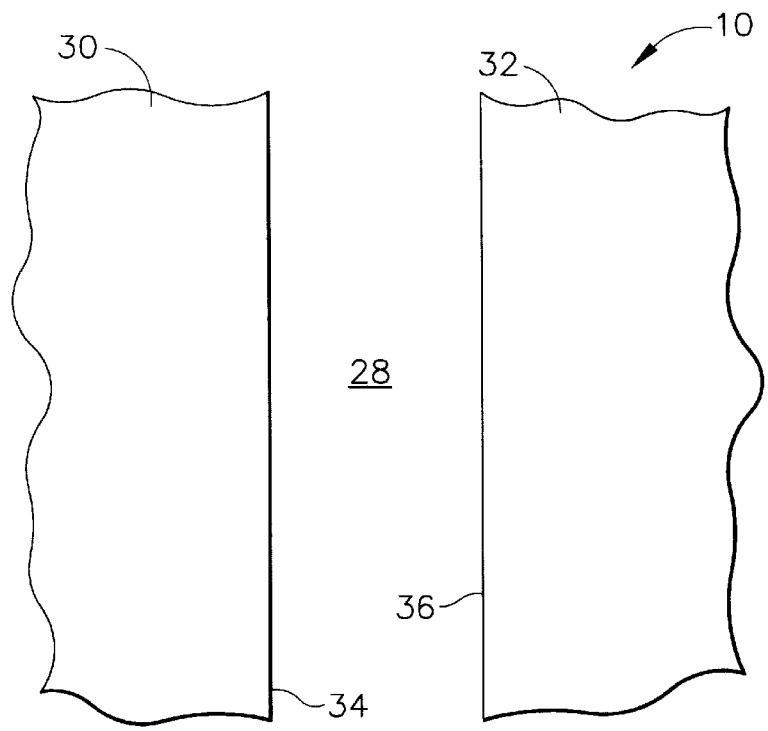
FIGS. 4 and 5 represent process steps for forming nano-scale features that form a fluid restrictor for fluid-handling applications.
Figure 5:
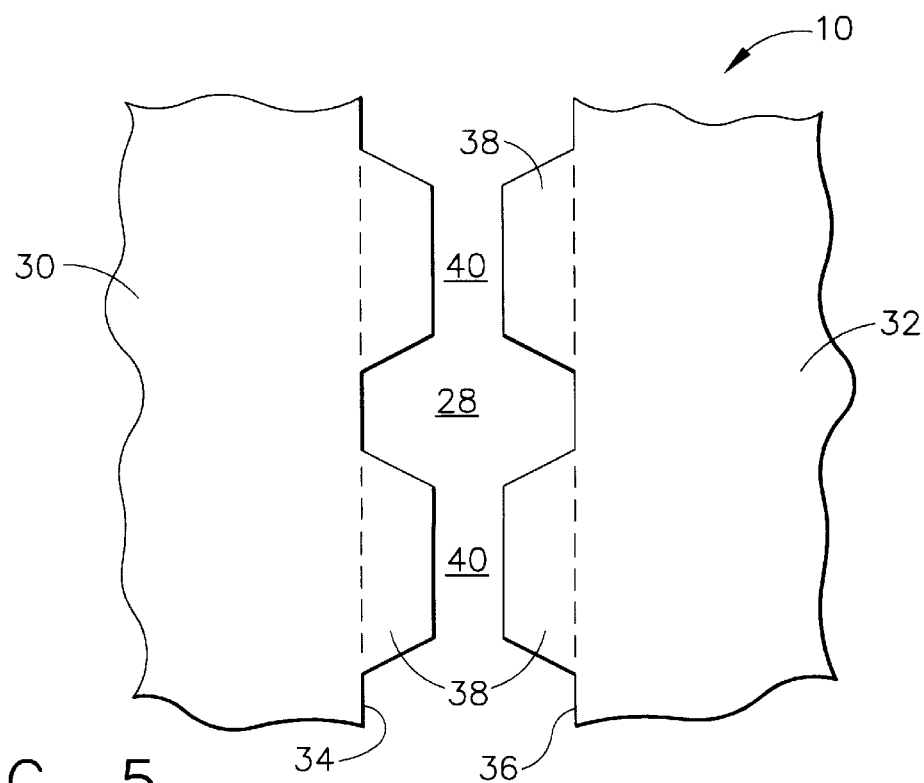
Figure 6:
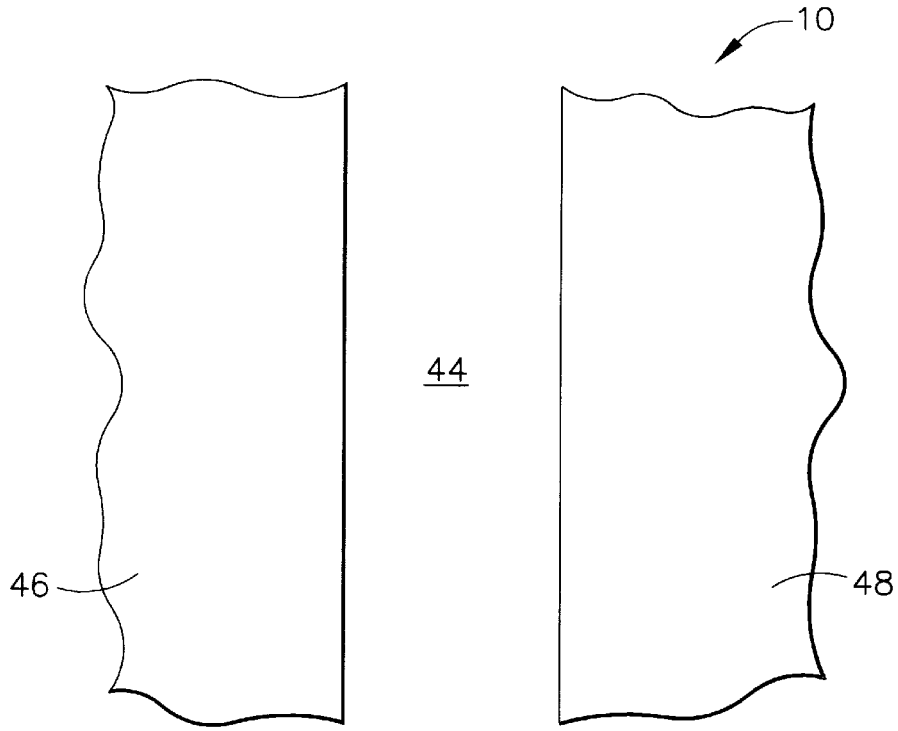
FIGS. 6 and 7 represent process steps for forming a nano-scale feature that forms an optical switch or light filter for optical applications.
Figure 7:
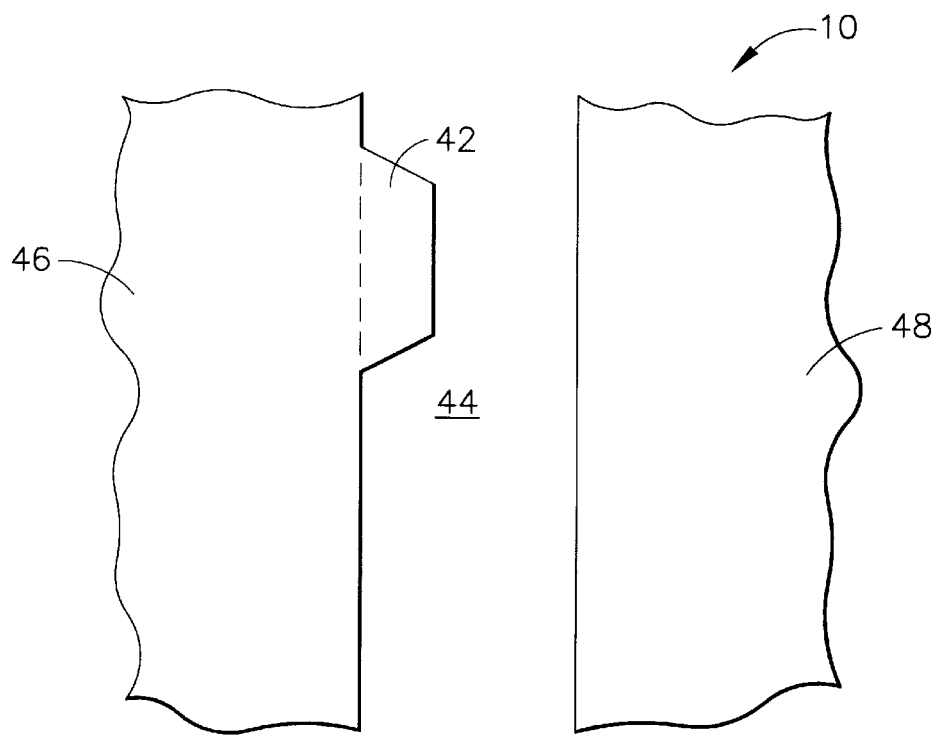

In FIGS. 2 and 3, the feature 18 has been formed as a cantilevered structure by etching or otherwise removing the lower barrier layer 14 from between the polycrystalline layer 12 and the underlying substrate, or by selectively etching the substrate from beneath the polycrystalline layer 12. The method of this invention is used to form the third feature 20 as an abutment to stabilize one end of the cantilever feature 18. Alternative structures and components possible with this invention are shown in FIGS. 4 through 11. In FIGS. 4 and 5, the metallization 10 has been patterned to form two features 30 and 32 with opposing and parallel patterned edges 34 and 36 separated by a trench 28. FIG. 5 shows the result of locally heating two regions along each edge 34 and 36 to form two pairs of "extrusions" 38. The extrusions 38 are paired so that two restrictions 40 are formed within the trench 28. In such an embodiment, after laminating a film (not shown) to the surface of the metallization 10 to enclose the trench 28, the restrictions 40 serve to restrict fluid flow through the trench 28. FIGS. 6 and 7 illustrate a similar embodiment, in which only a single extrusion 42 is formed to project into a trench 44 that separates a pair of features 46 and 48 patterned from the metallization 10. This embodiment of the invention is useful as an optical switch or light filter as a result of the nano-scale size of the extrusion 42.

Figure 8:
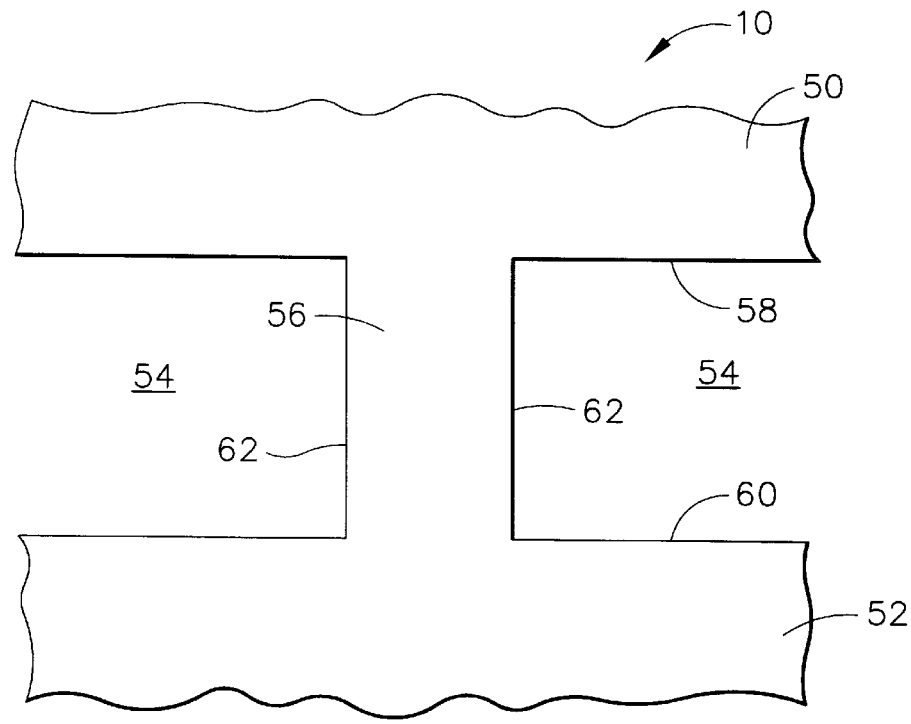
FIGS. 8 and 9 represent process steps for forming a nano-scale fuse for electrical applications.
Figure 9:
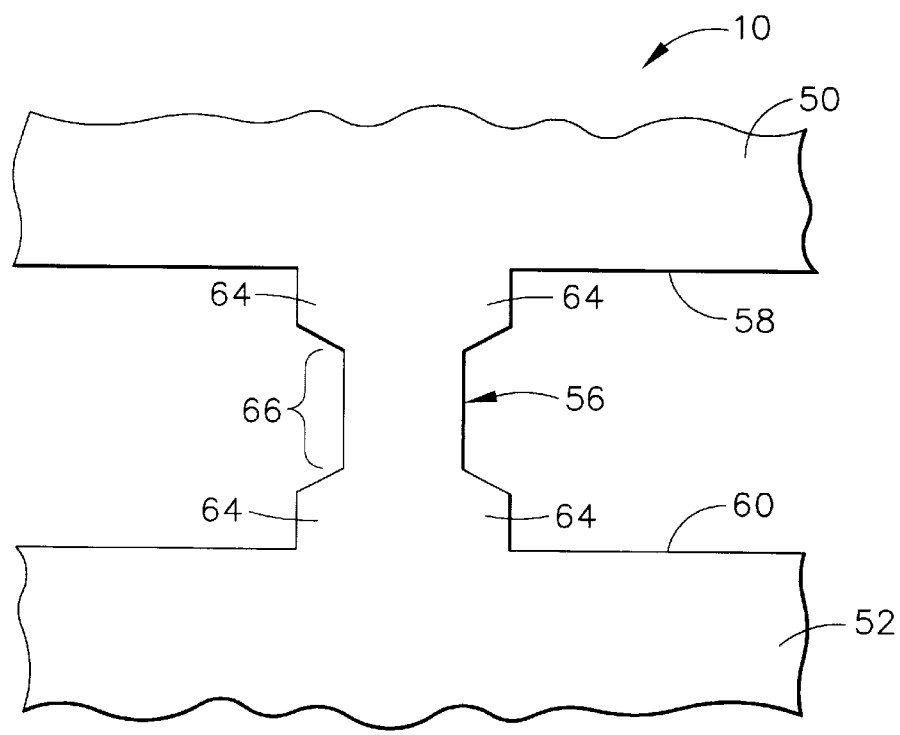

The present invention is also useful for forming nano-scale electrical components for a microcircuit formed from the metallization 10. In FIG. 8, a pair of features 50 and 52 are shown as being interconnected by a third feature 56 but otherwise separated by trenches 54. The trenches 54 are shown as being defined so that the features 50 and 52 have opposing and parallel edges 58 and 60, and the third feature 56 has two edges 62 that are perpendicular to the edges 58 and 60 of the features 50 and 52. In accordance with this invention, the edges 58 and 60 of the features 50 and 52 are spaced apart a distance that is preferably less than or equal to the average grain size of the polycrystalline layer 12. FIG. 9 represents the result of locally heating the four regions of the third feature 56 where its two edges 62 intersect the edges 58 and 60 of the features 50 and 52. As a result of the heating process, four extrusions 64 have formed due to grain growth of those grains of the polycrystalline layer 12 located within contiguous heated portions of the edges 58, 60 and 62. The extrusions 64 provide the third feature 56 with an hourglass shape, in which the width of the third feature 56 is greater at its intersections with the first and second features 50 and 52 than at a midsection 66 between the localized heated regions. This electrical structure is useful as a fuse or an "off" switch if the features 50 and 52 are current conductors. As a fuse, the midsection 66 would overheat and create an open circuit if a sufficiently high overcurrent condition occurred in the features 50 and 52. If overheated by an appropriate overcurrent condition., the midsection 66 can be configured to expand if so desired. As an off-switch, a laser or other suitable device could be used to sever the midsection 66 under appropriate conditions.

Figure 10:
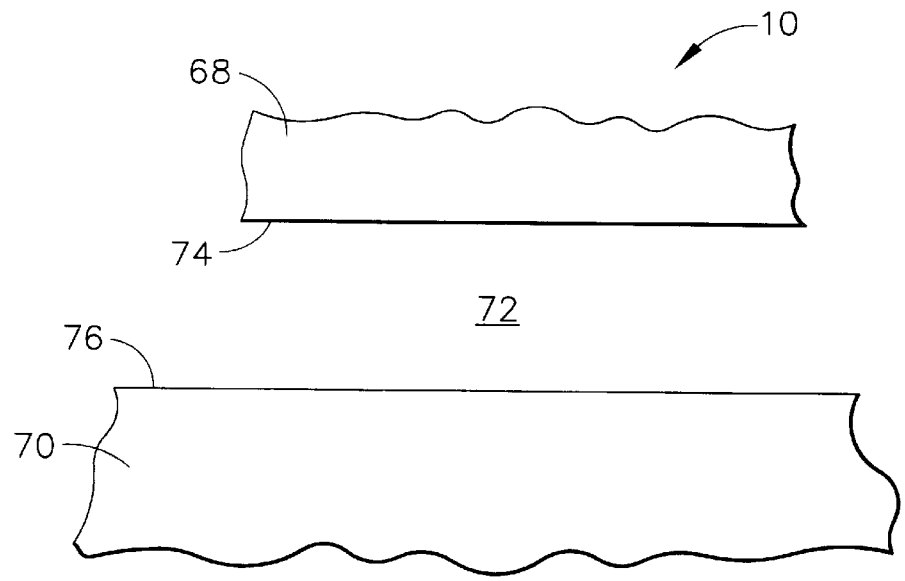
FIGS. 10 and 11 represent process steps for forming a nano-scale on-switch for electrical applications.
Figure 11:
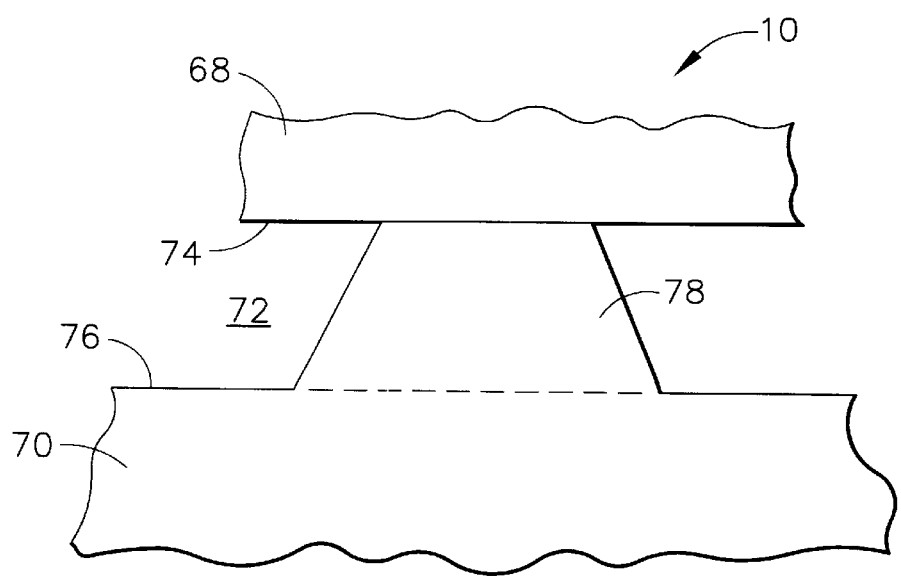

Finally, FIGS. 10 and 11 illustrate another electrical application for the invention. In FIG. 10, a pair of features 68 and 70 are shown as being delineated from the metallization 10 by a trench 72, so that the features 68 and 70 have opposing and parallel edges 74 and 76. FIG. 11 represents the result of locally heating a region of the feature 70 at or near its edge 76, by which an extrusion 78 is formed due to grain growth of those grains of the polycrystalline layer 12 that were heated. The width of the trench 72 is sufficiently narrow and the heating process is performed in such a manner as to cause the extrusion 78 to project across the trench 72 and contact the other feature 68. This electrical structure is useful as an "on" switch if the features 50 and 52 are current conductors. In use as an on-switch, a laser or other localized energy input could be used to heat the edge 76 of the feature 70 and form the extrusion 78, thereby electrically connecting the features 68 and 70 under appropriate conditions.

While the invention has been described in terms of preferred embodiments, it is apparent that other forms could be adopted by one skilled in the art. For example, while described in the context of metallizations, the teachings of this invention are applicable to other applications that might employ fine narrowly-spaced polycrystalline lines of essentially any type of material (e.g., conductive, dielectric or semiconductive). Accordingly, the scope of the invention is to be limited only by the following claims.

What is claimed is:

1. A method comprising the steps of:
    forming a multilayer structure on a substrate, the multilayer structure comprising a polycrystalline layer and a constraining layer, the polycrystalline layer comprising grains having a size distribution characterized by an average grain size;
    patterning the multilayer structure to form at least a first structure and a second structure, each of the first and second structures comprising the polycrystalline and constraining layers, the first and second structures having patterned edges; and
    locally heating at least the first structure, the constraining layer restricting thermal expansion of the polycrystalline layer of the first structure such that stresses induced in the polycrystalline layer cause substantially two-dimensional grain growth from the patterned edge of the first structure, the two-dimensional grain growth producing a third structure that is an operative component of a device chosen from the group consisting of electrical, mechanical, optical and fluid-handling devices.

2. A method according to claim 1, wherein sufficient two-dimensional grain growth occurs during the heating step to cause the third structure to contact the second structure.

3. A method according to claim 2, wherein the first and second structures are electrical conductors separated by a gap before the heating step, and the third structure is an electrical switch therebetween.

4. A method according to claim 2, wherein the second structure is formed during the patterning step to be a cantilevered structure, and the third structure abuts the cantilevered structure to substantially immobilize a portion of the cantilevered structure.

5. A method according to claim 1, wherein the patterned edges of the first and second structures are substantially parallel to each other and spaced apart from each other by a gap, and wherein the third structure projects across the gap toward the patterned edge of the second structure but does not contact the second structure so as to define a restriction between the first and second structures, the restriction filtering light radiating through the gap.

6. A method according to claim 1, wherein the patterned edges of the first and second structures are substantially parallel to each other and spaced apart from each other by a gap, and wherein the third structure projects across the gap toward the patterned edge of the second structure but does not contact the second structure so as to define a restriction between the first and second structures, the restriction functioning as an optical switch operating in response to light radiating through the gap.

7. A method according to claim 1, wherein the patterned edges of the first and second structures are substantially parallel to each other and spaced apart from each other by a gap, and wherein the third structure projects across the gap toward the patterned edge of the second structure but does not contact the second structure, a portion of the second structure also being locally heated during the heating step to cause substantially two-dimensional grain growth from the patterned edge of the second structure across the gap toward the patterned edge of the first structure, the two-dimensional grain growth from the second structure producing a fourth structure that is an operative component of the electrical, mechanical, optical or fluid-handling device.

8. A method according to claim 7, wherein the fourth structure does not contact the first structure.

9. A method according to claim 8, wherein the fourth structure is oppositely disposed from the third structure, the third and fourth structures forming a restriction between the first and second structures.

10. A method according to claim 9, wherein the restriction is a fluid flow restrictor.

11. A method according to claim 1, wherein the patterning step forms a fourth structure from the multilayer structure, the first structure being between and interconnecting the second and fourth structures, the fourth structure having a patterned edge separated from the patterned edge of the second structure by a gap.

12. A method according to claim 11, wherein the patterned edge of the first structure is substantially perpendicular to the patterned edges of the second and fourth structures.

13. A method according to claim 11, wherein the heating step causes the third structure to form at an intersection of the first and second structures and causes a fifth structure to form at an intersection of the first and fourth structures, so that the first structure is wider adjacent the second and fourth structures and is narrower at a midsection thereof.

14. A method according to claim 13, wherein the second and fourth structures are electrical conductors and the first structure is a fuse therebetween.

15. A method according to claim 1, wherein the first and second structures are spaced apart by a gap having a width that is less than the average grain size of the polycrystalline layer.

16. A method according to claim 1, wherein the polycrystalline layer is sandwiched between the constraining layer and a second layer, the second layer also constraining thermal expansion of the polycrystalline layer to cause two-dimensional grain growth from the polycrystalline layer of the first structure.

17. A method comprising the steps of:
forming a multilayer structure on a substrate, the multilayer structure comprising a polycrystalline metal layer sandwiched between first and second constraining layers, the polycrystalline metal layer comprising grains having a size distribution characterized by an average grain size;
patterning the multilayer structure to form a first structure and a second structure, each of the first and second structures comprising the polycrystalline metal layer and the first and second constraining layers the first and second structures having patterned edges substantially parallel to each other and separated by a gap so as to be spaced apart from each other, the polycrystalline metal layer of the first and second structures having grains with fewer than six grain boundaries at the patterned edges thereof, and
locally heating at least the first structure, the first and second constraining layers restricting thermal expansion of the polycrystalline metal layer of the first structure such that stresses induced in the polycrystalline metal layer cause the grains with fewer than six grain boundaries to undergo substantially two-dimensional grain growth from the patterned edge of the first structure across the gap toward the patterned edge of the second structure, the two-dimensional grain growth producing a third structure that is a nano-scale component of a device chosen from the group consisting of electrical, mechanical, optical and fluid-handling devices.

18. A method according to claim 17, wherein the gap between the first and second structures is less than the average grain size of the polycrystalline metal layer.

19. A method according to claim 18, wherein the heating step causes sufficient two-dimensional grain growth to cause the third structure to contact the second structure.

20. A method according to claim 19, wherein the first and second structures are electrical conductors and the third structure is an electrical switch therebetween.

21. A method according to claim 19, wherein the second structure is formed during the patterning step to be a cantilevered structure, and the third structure abuts the cantilevered structure to substantially immobilize a portion of the cantilevered structure.

22. A method according to claim 17, wherein the third structure projects across the gap toward the patterned edge of the second structure but does not contact the second structure so as to define a restriction between the first and second structures, the restriction filtering light radiating through the gap.

23. A method according to claim 17, wherein the third structure projects across the gap toward the patterned edge of the second structure but does not contact the second structure so as to define a restriction between the first and second structures, the restriction functioning as an optical switch operating in response to light radiating through the gap.

24. A method according to claim 17 wherein the third structure projects across the gap toward the patterned edge of the second structure but does not contact the second structure, a portion of the second structure also being locally heated during the heating step to cause the grains thereof with fewer than six grain boundaries to undergo substantially two-dimensional grain growth from the patterned edge of the second structure toward the patterned edge of the first structure, the two-dimensional grain growth from the second structure producing a fourth structure that does not contact the first structure, the fourth structure being oppositely disposed from the third structure so as to form a restriction therebetween.

25. A method according to claim 24, wherein the restriction is a fluid flow restrictor.

26. A method comprising the steps of:
forming a multilayer structure on a substrate, the multilayer structure comprising a polycrystalline metal layer sandwiched between first and second constraining layers, the polycrystalline metal layer comprising grains having a size distribution characterized by an average grain size;
patterning the multilayer structure to form first, second and third structures, each of the first, second and third structures comprising the polycrystalline metal layer and the first and second constraining layers, the first and second structures having patterned edges substantially parallel to each other and separated by a gap so as to be spaced apart from each other, the third structure being between and interconnecting the first and second structures, the third structure having two patterned edges that intersect the patterned edges of the first and second structures, the polycrystalline metal layer of the third structure having grains with fewer than six grain boundaries at each of the two patterned edges thereof; and
heating the third structure at intersections where the two patterned edges of the third structure intersect the patterned edges of the first and second structures, the first and second constraining layers restricting thermal expansion of the polycrystalline metal layer of the third structure such that stresses induced in the polycrystalline metal layer cause the grains with fewer than six grain boundaries to undergo substantially two-dimensional grain growth from the two patterned edge of the third structure at each of the intersections between the two patterned edges of the third structure and the patterned edges of the first and second structures, the two-dimensional grain growth increasing the width of the third structure where the third structure intersects the first and second structures so that the third structure is wider where the third structure intersects the first and second structures as compared to a midsection thereof.

27. A method according to claim 26, wherein the two patterned edges of the third structure are substantially perpendicular to the patterned edges of the first and second structures.

28. A method according to claim 26, wherein the first and second structures are electrical conductors and the third structure is a fuse therebetween.

29. A component of a device chosen from the group consisting of electrical, mechanical, optical and fluid-handling devices, the component comprising:
first and second structures on a substrate each of the first and second structures comprising a polycrystalline layer and a constraining layer that constrains thermal expansion of the polycrystalline layer, the polycrystalline layers comprising grains having a size distribution characterized by an average grain size, each of the first and second structures having patterned edges; and a nano-scale third structure formed by substantially two-dimensional grain growth from the polycrystalline layer at the patterned edge of the first structure.

30. A component according to claim 29, wherein the third structure contacts the second structure.

31. A component according to claim 30, wherein the first and second structures are electrical conductors separated by a gap, and the third structure is an electrical switch therebetween.

32. A component according to claim 30, wherein the second structure is cantilevered and the third structure abuts the second structure to substantially immobilize a cantilevered portion of the second structure.

33. A component according to claim 29, wherein the patterned edges of the first and second structures are substantially parallel to each other and spaced apart from each other by a gap, and wherein the third structure projects across the gap toward the patterned edge of the second structure but does not contact the second structure so as to define a restriction between the first and second structures, the restriction filtering light radiating through the gap.

34. A component according to claim 29, wherein the patterned edges of the first and second structures are substantially parallel to each other and spaced apart from each other by a gap, and wherein the third structure projects across the gap toward the patterned edge of the second structure but does not contact the second structure so as to define a restriction between the first and second structures, the restriction being an optical switch operable in response to light radiating through the gap.

35. A component according to claim 29, wherein the patterned edges of the first and second structures are substantially parallel to each other and spaced apart from each other by a gap, and wherein the third structure projects across the gap toward the patterned edge of the second structure but does not contact the second structure, the component further comprising a nano-scale fourth structure defined by substantially two-dimensional grain growth from the patterned edge of the second structure, the fourth structure projecting across the gap toward the patterned edge of the first structure.

36. A component according to claim 35, wherein the fourth structure does not contact the first structure.

37. A component according to claim 36, wherein the fourth structure is oppositely disposed from the third structure, the third and fourth structures defining a restriction between the first and second structures.

38. A component according to claim 37, wherein the restriction is a fluid flow restrictor.

39. A component according to claim 29, further comprising a fourth structure comprising a polycrystalline layer and a constraining layer, the first structure being between and interconnecting the second and fourth structures, the fourth structure having a patterned edge separated from the patterned edge of the second structure by a gap.

40. A component according to claim 39, wherein the patterned edge of the first structure is substantially perpendicular to the patterned edges of the second and fourth structures.

41. A component according to claim 39, wherein the third structure is at an intersection of the first and second structures, the component further comprising a nano-scale fifth structure at an intersection of the first and fourth structures so that the first structure is wider adjacent the second and fourth structures and is narrower at a midsection thereof.

42. A component according to claim 41, wherein the second and fourth structures are electrical conductors and the first structure is a fuse therebetween.

43. A component according to claim 29, wherein the first and second structures are spaced apart by a gap having a width that is less than the average grain size of the polycrystalline layers.

44. A component according to claim 29, wherein the polycrystalline layers of the first and second structures are sandwiched between the constraining layer and a second layer, the second layer constraining thermal expansion of the polycrystalline layers.

* * * * *